(12) United States Patent
Koyama

(10) Patent No.: US 12,034,093 B2
(45) Date of Patent: Jul. 9, 2024

(54) SEMICONDUCTOR DEVICE

(71) Applicant: SONY SEMICONDUCTOR SOLUTIONS CORPORATION, Kanagawa (JP)

(72) Inventor: Toshiki Koyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 369 days.

(21) Appl. No.: 17/310,146

(22) PCT Filed: Nov. 25, 2019

(86) PCT No.: PCT/JP2019/046004
§ 371 (c)(1),
(2) Date: Jul. 21, 2021

(87) PCT Pub. No.: WO2020/158130
PCT Pub. Date: Aug. 6, 2020

(65) Prior Publication Data
US 2022/0093806 A1    Mar. 24, 2022

(30) Foreign Application Priority Data

Jan. 30, 2019 (JP) ................................. 2019-013978

(51) Int. Cl.
*H01L 31/024*     (2014.01)
*H01L 27/146*     (2006.01)

(52) U.S. Cl.
CPC ...... *H01L 31/024* (2013.01); *H01L 27/14634* (2013.01)

(58) Field of Classification Search
CPC ............ H01L 31/024; H01L 27/14634; H01L 27/14618; H01L 23/12; H01L 23/36
See application file for complete search history.

(56) References Cited

U.S. PATENT DOCUMENTS

2009/0200629 A1* 8/2009 Asami ............... H01L 27/14618
257/E31.118

FOREIGN PATENT DOCUMENTS

| JP | 01-303745 A | 12/1989 |
| JP | 2004-221248 A | 8/2004 |
| JP | 2008-091677 A | 4/2008 |

(Continued)

OTHER PUBLICATIONS

Machine translation of Matsumoto (JP-2010263004) (Year: 2010).*

(Continued)

*Primary Examiner* — Yasser A Abdelaziez
(74) *Attorney, Agent, or Firm* — CHIP LAW GROUP

(57) ABSTRACT

Heat is efficiently discharged without impairing an imaging characteristic of a solid-state imaging element mounted on a substrate. A semiconductor device is provided with a substrate, the solid-state imaging element, and an adhesive portion that adheres the substrate and the solid-state imaging element. The substrate is a substrate provided with metal wiring. The solid-state imaging element is mounted on a surface of the substrate. The adhesive portion adheres a predetermined region on one surface of the solid-state imaging element to the substrate. The adhesive portion has predetermined thermal conductivity and discharges heat generated in the solid-state imaging element toward the substrate.

10 Claims, 13 Drawing Sheets

(56) References Cited

FOREIGN PATENT DOCUMENTS

| | | | |
|---|---|---|---|
| JP | 2008-177241 | A | 7/2008 |
| JP | 2010-263004 | A | 11/2010 |
| JP | 2011198863 | * | 10/2011 |
| JP | 2012-227270 | A | 11/2012 |

OTHER PUBLICATIONS

Machine translation of JP2011198863 (Year: 2011).*
International Search Report and Written Opinion of PCT Application No. PCT/JP2019/046004, dated Feb. 4, 2020, 11 pages of ISRWO.

* cited by examiner

SEMICONDUCTOR DEVICE

CROSS REFERENCE TO RELATED APPLICATIONS

This application is a U.S. National Phase of International Patent Application No. PCT/JP2019/046004 filed on Nov. 25, 2019, which claims priority benefit of Japanese Patent Application No. JP 2019-013978 filed in the Japan Patent Office on Jan. 30, 2019. Each of the above-referenced applications is hereby incorporated herein by reference in its entirety.

TECHNICAL FIELD

The present technology relates to a semiconductor device. More specifically, the present invention relates to a semiconductor device in which a solid-state imaging element is mounted on a substrate.

BACKGROUND ART

Conventionally, in a semiconductor device in which a semiconductor chip is mounted on a substrate, there has been a problem of how to discharge heat generated from the semiconductor chip. For example, a semiconductor package is proposed in which a heat generation part of the semiconductor chip is locally exposed and cooled by contact with a heat sink member (refer to, for example, Patent Document 1). Furthermore, for example, a semiconductor device is proposed in which a housing of a semiconductor chip and a heat radiation fin are adhered with each other with heat-transfer grease (refer to, for example, Patent Document 2).

CITATION LIST

Patent Document

Patent Document 1: Japanese Patent Application Laid-Open No. 2008-177241
Patent Document 2: Japanese Patent Application Laid-Open No. 2008-091677

SUMMARY OF THE INVENTION

Problems to be Solved by the Invention

In the above-described conventional technology, heat generated when the semiconductor chip operates is discharged by providing a cooling member on a surface of the semiconductor chip, that is, the surface opposite to a surface facing the substrate. However, in a case where the semiconductor chip is a solid-state imaging element, it is necessary to allow external light to be incident on a pixel unit, so that it is not possible to shield light on the chip surface. Furthermore, when temperature distribution in the solid-state imaging element varies due to heat generation, an image quality of an image to be captured might be locally deteriorated.

The present technology has been achieved in view of such a situation, and an object thereof is to efficiently discharge heat without impairing an imaging characteristic in the solid-state imaging element.

Solutions to Problems

The present technology is achieved in view of solving the above-described problem, and a first aspect thereof is a semiconductor device provided with a substrate provided with metal wiring, a solid-state imaging element mounted on a surface of the substrate, and an adhesive portion having predetermined thermal conductivity, the adhesive portion that adheres a predetermined region on one surface of the solid-state imaging element to the substrate. This brings an effect of discharging heat generated in the solid-state imaging element toward the metal wiring of the substrate via the adhesive portion.

Furthermore, in the first aspect, the adhesive portion may have a larger area in a high temperature portion than in a low temperature portion according to temperature distribution of the solid-state imaging element. This brings an effect of discharging the heat by the area according to the temperature distribution.

Furthermore, in the first aspect, the substrate may be provided with an insulating film on the surface, the insulating film on the substrate may be provided with an exposed portion that opens in the predetermined region to expose the metal wiring, and the adhesive portion may adhere the predetermined region of the solid-state imaging element to the metal wiring of the substrate. This brings an effect of adhering the adhesive portion to the metal wiring of the substrate in the exposed portion to discharge the heat.

Furthermore, in the first aspect, more exposed portions may be arranged in a high temperature portion than in a low temperature portion according to temperature distribution of the solid-state imaging element. This brings an effect of discharging the heat via the exposed portions the number of which corresponds to the temperature distribution.

Furthermore, in the first aspect, exposed portions may be arranged in a high temperature portion at higher density than in a low temperature portion according to temperature distribution of the solid-state imaging element. This brings an effect of discharging the heat via the exposed portions the density of which corresponds to the temperature distribution.

Furthermore, in the first aspect, exposed portions may have a plurality of circular shapes. Furthermore, they may also have other shapes such as elliptical or rectangular shapes.

Furthermore, in the first aspect, the predetermined region may be a region in which temperature reaches maximum temperature when the solid-state imaging element operates. This brings an effect of discharging the heat toward the metal wiring of the substrate via the adhesive portion in the region set according to the maximum temperature when the solid-state imaging element operates.

Furthermore, in the first aspect, the predetermined region may be a region occupied by a predetermined circuit in the solid-state imaging element. This brings an effect of discharging the heat toward the metal wiring of the substrate via the adhesive portion in the region occupied by the predetermined circuit. Note that the predetermined circuit may be, for example, an analog-to-digital conversion circuit or a predetermined logic circuit.

Furthermore, in the first aspect, the adhesive portion may be provided with a plurality of types of adhesives having different thermal conductivities according to temperature distribution of the solid-state imaging element. This brings an effect of adjusting a heat radiation property according to the temperature distribution.

MODE FOR CARRYING OUT THE INVENTION

A mode for carrying out the present technology (hereinafter, referred to as an embodiment) is hereinafter described. The description is given in the following order.
1. First Embodiment (example of solid-state imaging element obtained by forming pixel and circuit on same silicon substrate)
2. Second Embodiment (example of solid-state imaging element having stacked structure)
3. Modified Example 1. First Embodiment

Figure 1:
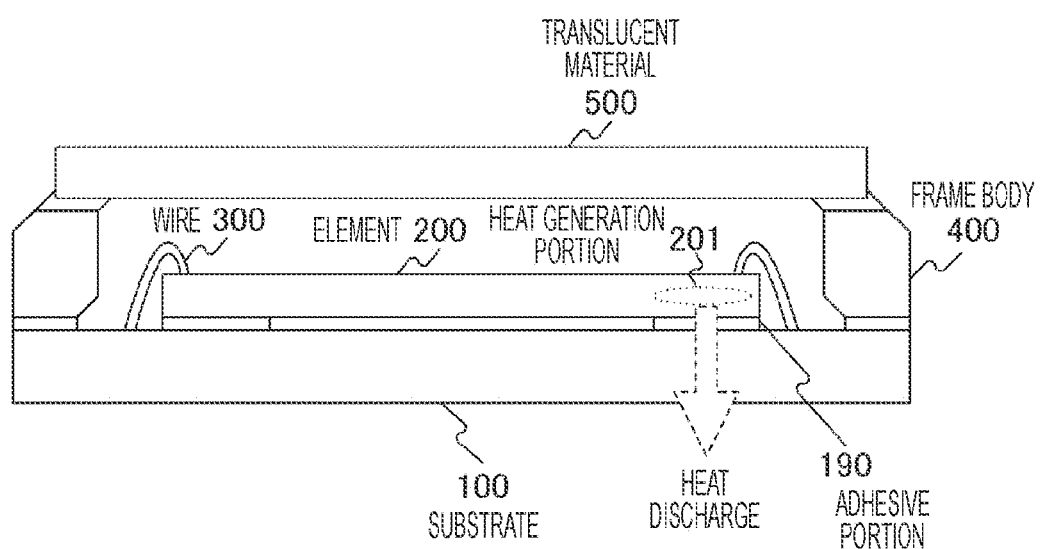
FIG. 1 is a cross-sectional view illustrating an example of a structure of a semiconductor device in an embodiment of the present technology.

[Structure of Semiconductor Device]
FIG. 1 is a cross-sectional view illustrating an example of a structure of a semiconductor device in an embodiment of the present technology.

In this semiconductor device, an element 200 is mounted on a surface of a silicon substrate 100 serving as a base. The element 200 is a semiconductor chip, and in the following embodiment, a solid-state imaging element is assumed. That is, the element 200 is an example of a solid-state imaging element recited in claims.

A predetermined region on a surface of the element 200 mounted on the substrate 100 is selectively adhered to the substrate 100 via an adhesive portion 190. Here, the predetermined region is a region directly below a heat generation portion 201 of the element 200 referred to as a hot spot (local high-temperature portion). In a normal case, it is designed so as not to exceed guaranteed heat resistant temperature, so that it is difficult to assume that extremely high temperature is generated even in the hot spot. However, a part of the element 200 might reach temperature close to the guaranteed heat resistant temperature (for example, about 60° C.)

The substrate 100 is the substrate serving as the base of the semiconductor device, and for example, a printed circuit board is assumed. A solder resist is formed on the surface of the substrate 100 as an insulating film for protection. Then, on the substrate 100 on which the element 200 is mounted, the solder resist is opened in advance in the position directly below the heat generation portion 201 of the element 200. Therefore, metal wiring of the substrate 100 is exposed.

The adhesive portion 190 is applied to a portion in which the metal wiring of the substrate 100 is exposed. The adhesive portion 190 is an adhesive having predetermined thermal conductivity. The region directly below the heat generation portion 201 of the element 200 is adhered to the portion in which the metal wiring of the substrate 100 is exposed via the adhesive portion 190. Therefore, heat of the heat generation portion 201 is discharged toward the metal wiring.

An input/output terminal of the element 200 is arranged in a peripheral portion of an upper surface, and is electrically connected to the substrate 100 by wire bonding via a wire 300. As the wire 300, for example, a gold wire is assumed.

The substrate 100 is provided with a frame body 400 around the element 200. Then, a translucent material 500 such as glass is provided on an upper part of the frame body 400. At these assembling steps, a hollow sealing structure is formed that allows external light to be incident on a pixel unit of an imaging surface of the element 200 as the solid-state imaging element.

Figure 2A:
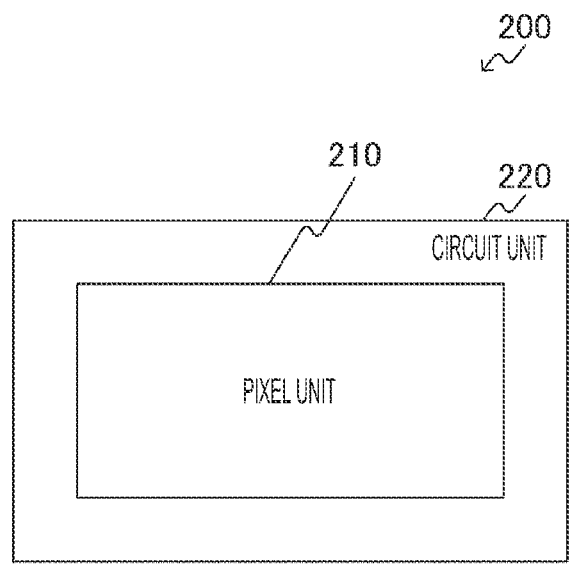
FIGS. 2A and 2B are views illustrating an example of temperature distribution of an element 200 in a first embodiment of the present technology.
Figure 2B:
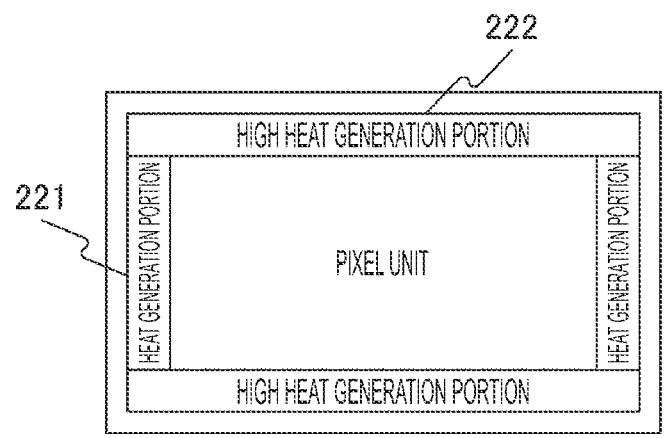

[Temperature Distribution of Element]
FIGS. 2A and 2B are views illustrating an example of temperature distribution of the element 200 in a first embodiment of the present technology.

In the element 200, as illustrated in FIG. 2A of the drawing, a pixel unit 210 serving as a light-receiving surface is formed in a substantially central portion of the surface, and a circuit unit 220 other than this is formed around the pixel unit 210. As the circuit unit 220, for example, a signal processing circuit such as an analog-to-digital (AD) conversion circuit is assumed. That is, the circuit unit 220 is an example of an analog-to-digital conversion circuit recited in claims. However, this is merely an example, and other logic circuits may also be applied.

When the element 200 as the solid-state imaging element is driven, the circuit unit 220 mainly generates heat. However, a heat generation amount differs depending on a function of the circuit, and for example, as illustrated in FIG. 2B of the drawing, a heat generation portion 221 of normal heat and a high heat generation portion 222 of higher heat might occur. If an influence of the heat reaches the pixel unit 210 in the vicinity, image quality deterioration such as an increase in noise might occur.

Figure 3A:
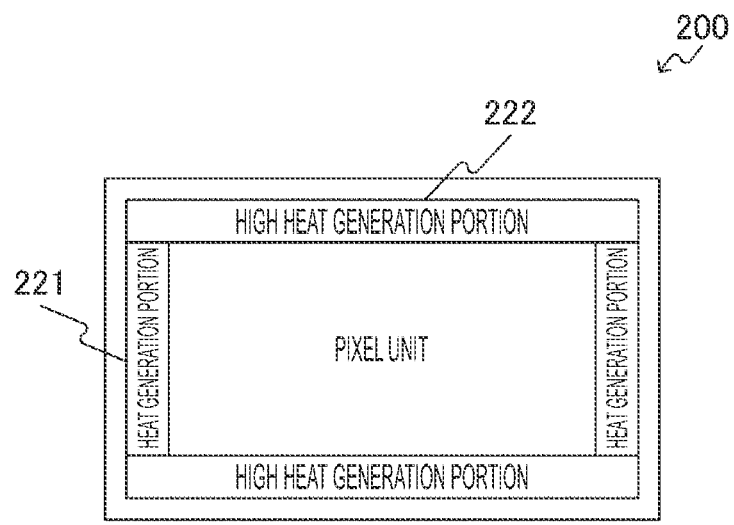
FIGS. 3A and 3B are top views for illustrating a structure example of a substrate 100 in the first embodiment of the present technology.
Figure 3B:
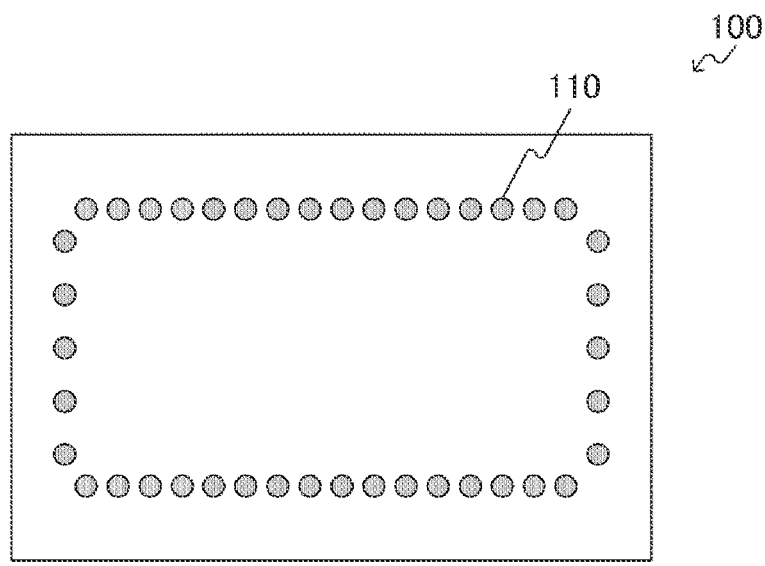

FIGS. 3A and 3B are top views for illustrating a structure example of the substrate 100 in the first embodiment of the present technology.

As described above, as illustrated in FIG. 3A of the drawing, in the element 200, the circuit unit 220 around the pixel unit 210 serves as a main heat generating source. Therefore, as illustrated in FIG. 3B of the drawing, the substrate 100 is provided with circular or dot-shaped openings of the solder resist in advance in positions directly below the heat generation portions 221 and 222 of the element 200, and they are allowed to serve as exposed portions 110 in which the metal wiring of the substrate 100 is exposed.

At that time, in the element 200, it is desirable that a large number of openings are provided directly below the high heat generation portion 222 in which generated heat is relatively high, and a small number of openings are provided directly below the heat generation portion 221 in which the generated heat is relatively low as the exposed portions 110. Furthermore, it is desirable that the openings are provided directly below the high heat generation portion 222 at higher density as compared to those directly below the heat generation portion 221 as the exposed portions 110.

Furthermore, in this example, although the openings of the exposed portions 110 have a plurality of circular shapes, they may also have elliptical or rectangular shapes other than them.

[Manufacturing Step]

Figure 4A:
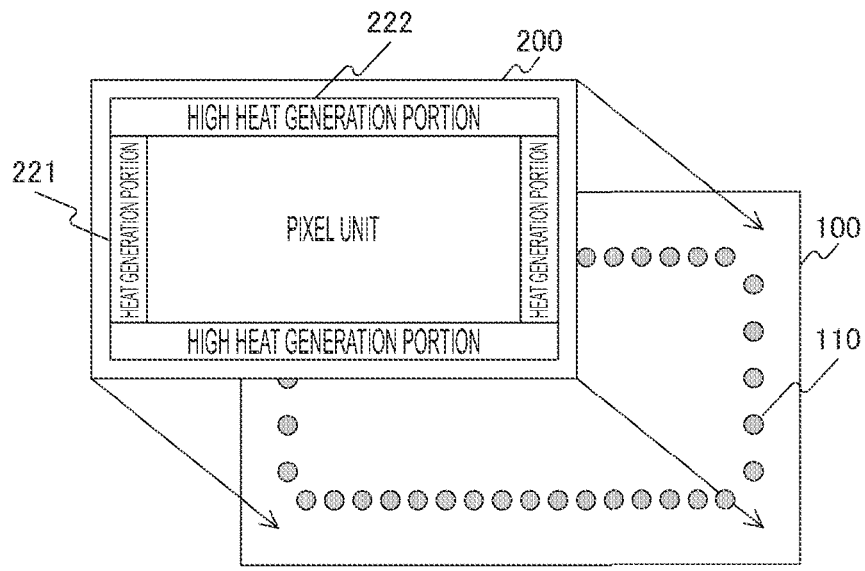
FIGS. 4A, 4B, and 4C are views illustrating an example of steps of mounting the element 200 on the substrate 100 in the first embodiment of the present technology.
Figure 4B:
Figure 4B:
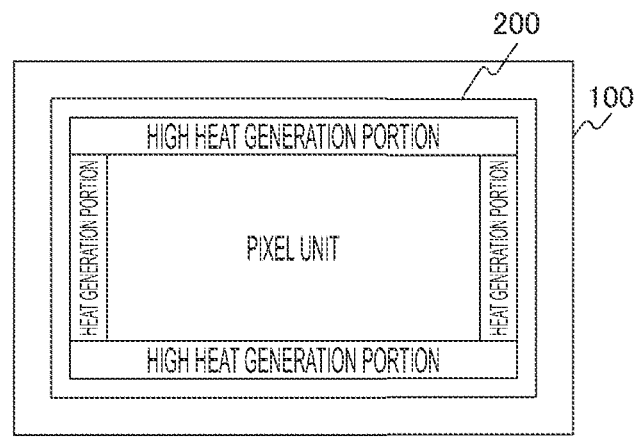
Figure 4C:
Figure 4C:

FIGS. 4A, 4B, and 4C are views illustrating an example of steps of mounting the element 200 on the substrate 100 in the first embodiment of the present technology.

As illustrated in FIG. 4A of the drawing, the exposed portions 110 in which the solder resist is opened and the metal wiring is exposed are provided on the substrate 100 in the positions directly below the heat generation portions 221 and 222 of the element 200.

Then, as illustrated in FIG. 4B of the drawing, the element 200 is mounted on the surface of the substrate 100. At that time, the adhesive portion 190 is applied to the exposed portions 110 of the substrate 100 as illustrated in a cross-sectional view in FIG. 4C of the drawing. Therefore, the exposed portions 110 of the substrate 100 are adhered to the heat generation portions 221 and 222 of the element 200 via the adhesive portion 190.

Figure 5A:
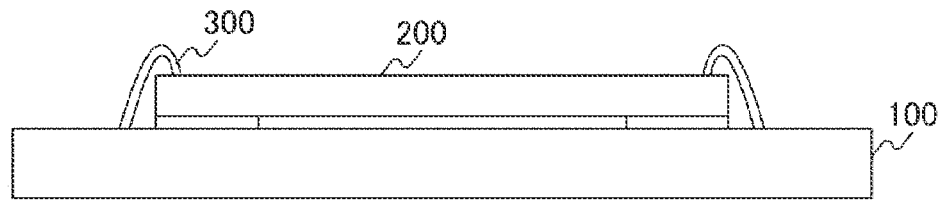
FIGS. 5A, 5B, and 5C are views illustrating an example of steps of manufacturing a semiconductor device including the substrate 100 and the element 200 in the first embodiment of the present technology.
Figure 5B:
Figure 5B:
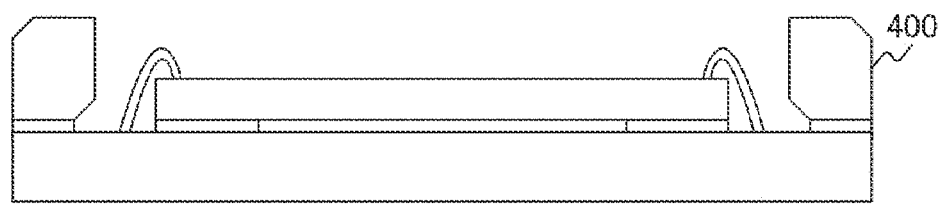
Figure 5C:
Figure 5C:
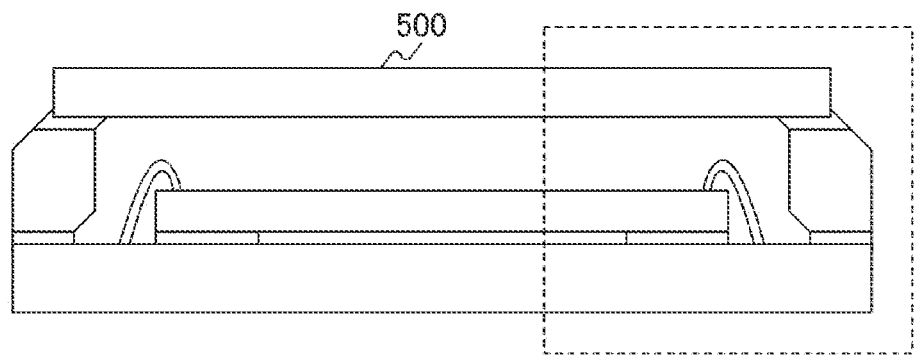

FIGS. 5A, 5B, and 5C are views illustrating an example of steps of manufacturing the semiconductor device including the substrate 100 and the element 200 in the first embodiment of the present technology.

As illustrated in FIG. 5A of the drawing, the wire 300 is used to wire bond for electrically connecting the input/output terminal arranged in the peripheral portion of the upper surface of the element 200 and the substrate 100.

Then, as illustrated in FIG. 5B of the drawing, the frame body 400 is adhered to the substrate 100 in the peripheral portion of the element 200. Moreover, as illustrated in c of the drawing, the translucent material 500 is adhered to the upper part of the frame body 400. Therefore, the semiconductor device is formed.

Note that an enlarged view of a portion enclosed by dotted line in FIG. 5C of the drawing is illustrated in a next drawing.

Figure 6:
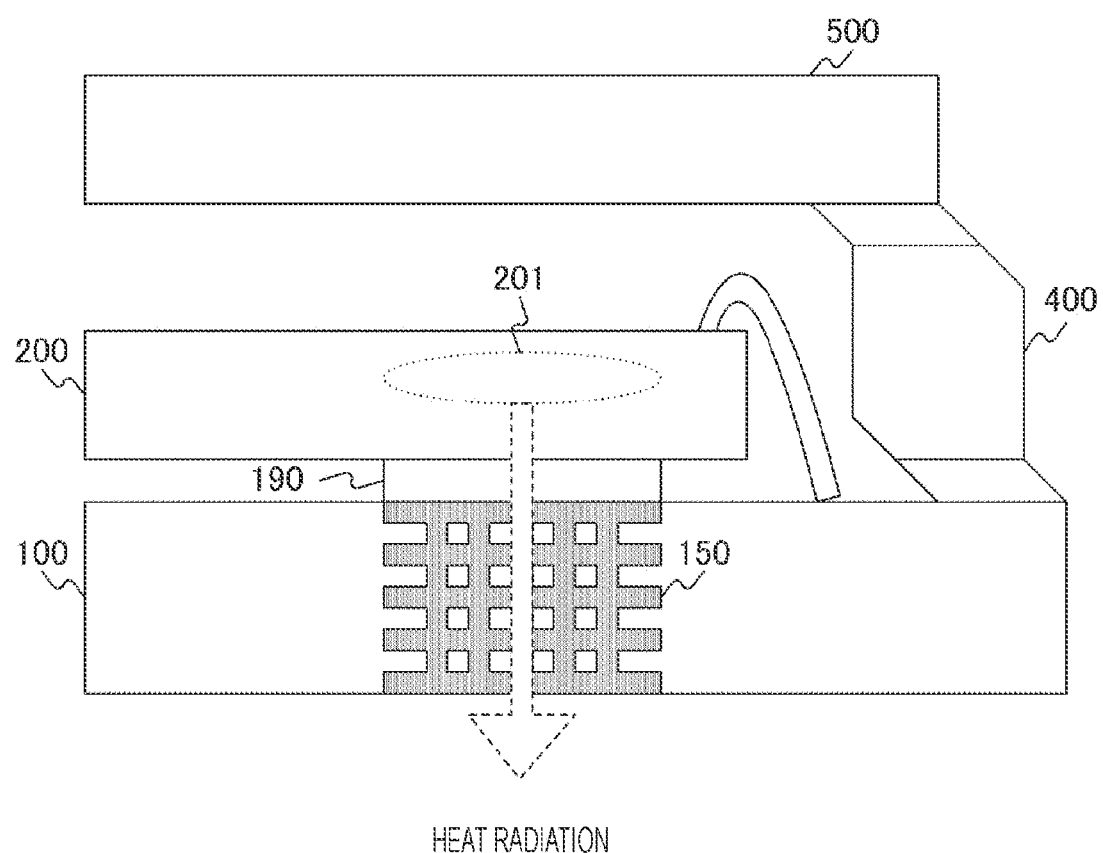
FIG. 6 is a view illustrating an example of heat radiation in the first embodiment of the present technology.

FIG. 6 is a view illustrating an example of heat radiation in the first embodiment of the present technology.

As illustrated in the drawing, since the region directly below the heat generation portion 201 of the element 200 is adhered to metal wiring 150 of the substrate 100 via the adhesive portion 190, a structure is such that heat is easily radiated through the metal wiring 150 in the substrate 100.

In this manner, in the first embodiment of the present technology, the exposed portions 110 in which the metal wiring is exposed are provided on the substrate 100 in the positions directly below the heat generation portions 221 and 222 of the element 200, and both of them are selectively adhered to each other via the adhesive portion 190. Therefore, the heat generated in the element 200 may be radiated from the metal wiring 150 in the substrate 100.

2. Second Embodiment

In the first embodiment described above, assumed is a case where the solid-state imaging element is formed on the same silicon substrate, but in recent years, a solid-state imaging element formed by a stacked structure is used. Therefore, in a second embodiment, an example in which the solid-state imaging element having the stacked structure is assumed is described.

[Structure of Semiconductor Device]

Figure 7:
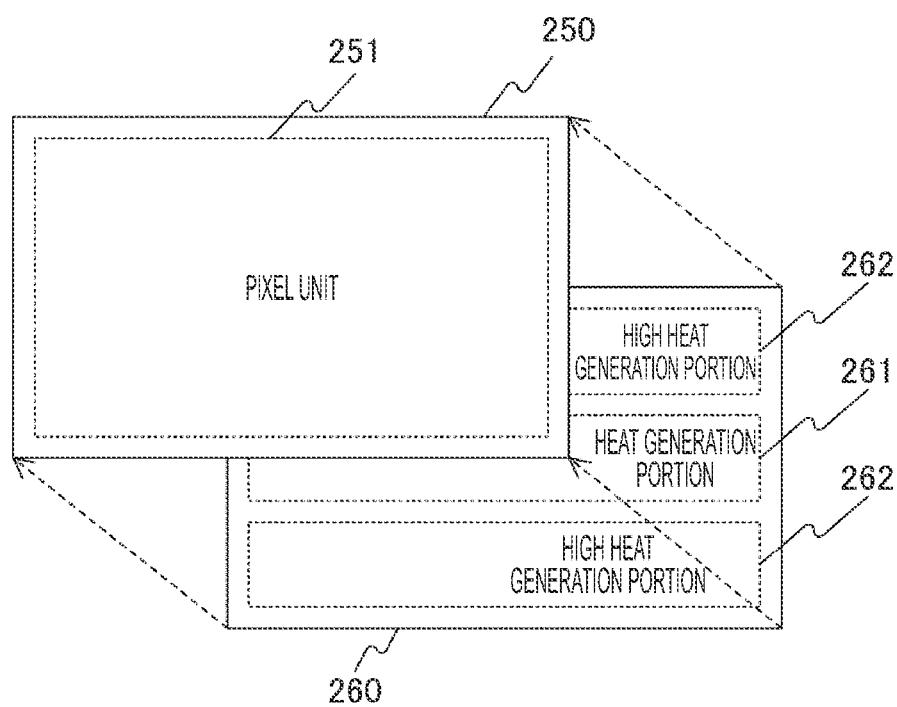
FIG. 7 is a view illustrating an example of a solid-state imaging element having a stacked structure in a second embodiment of the present technology.

FIG. 7 is a view illustrating an example of the solid-state imaging element having the stacked structure in the second embodiment of the present technology.

The solid-state imaging element having the stacked structure is provided with, for example, a structure in which a layer 250 including a pixel unit 251 serving as a light-receiving surface and a layer 260 including a signal processing circuit unit for AD conversion and the like are stacked. As described above, at the time of drive as the solid-state imaging element, the circuit unit mainly generates heat. At that time, depending on a function of the circuit, a heat generation portion 261 of normal heat and a high heat generation portion 262 of higher heat might occur. If an influence of the heat reaches the pixel unit 251 in another layer 250, image quality deterioration such as an increase in noise might occur.

Figure 8A:
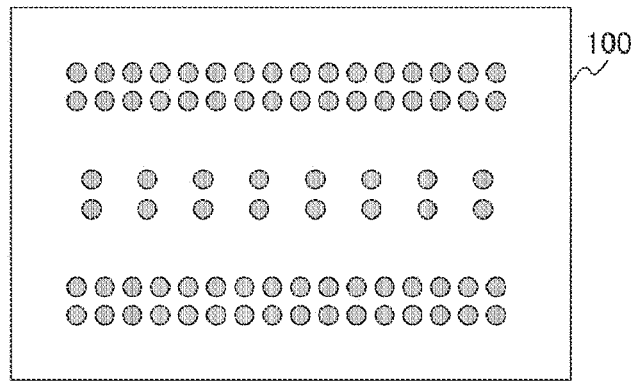
FIGS. 8A, 8B, and 8C are top views for illustrating a structure example of a substrate 100 in the second embodiment of the present technology.
Figure 8B:
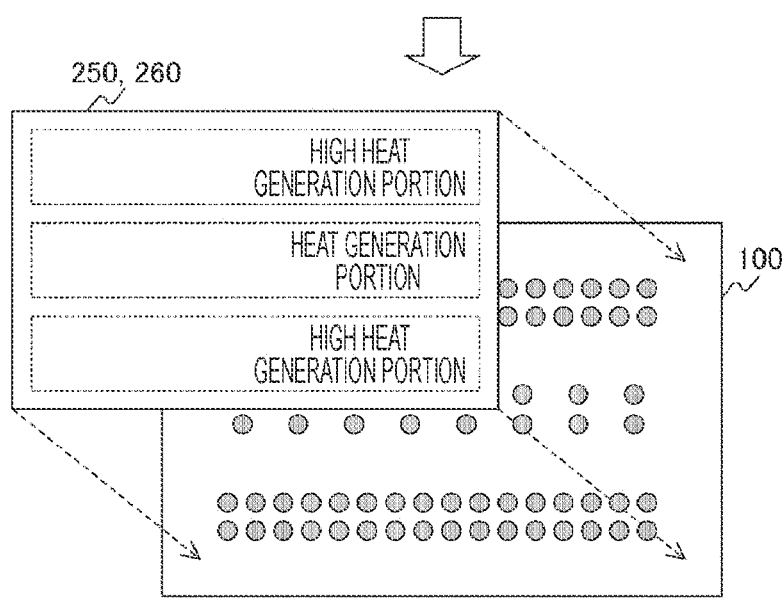
Figure 8C:
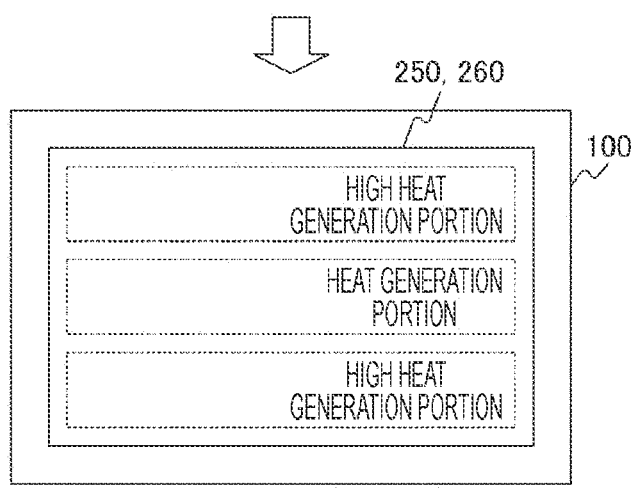

FIGS. 8A, 8B, and 8C are top views for illustrating a structure example of a substrate 100 in the second embodiment of the present technology.

As described above, the circuit unit of the layer 260 serves as a main heat generating source. Therefore, as illustrated in FIG. 8A of the drawing, the substrate 100 is provided with openings of a solder resist in advance in positions directly below the heat generation portions 261 and 262, and they are allowed to serve as exposed portions 110 in which metal wiring of the substrate 100 is exposed.

Then, as illustrated in FIG. 8B of the drawing, the solid-state imaging element having the stacked structure including the layers 250 and 260 is mounted on the substrate 100. At that time, an adhesive portion 190 having thermal conductivity is applied to the exposed portions 110 of the substrate 100, and the element is adhered thereto. Therefore, as illustrated in FIG. 8C of the drawing, regions directly below the heat generation portions 261 and 262 of the element are adhered to the substrate 100 by the adhesive portion 190.

Note that a subsequent manufacturing step is similar to that of the above-described first embodiment, so that the detailed description thereof is omitted.

In general, heat generation of the element has in-surface distribution, so that it is possible to reduce temperature distribution in the surface to uniformize by allowing the substrate 100 in the position directly below the high heat generation portion 262 to expose more metal wiring to radiate heat via the adhesive portion 190. Furthermore, it is also possible to adjust the number and area of the exposed portions 110 of the metal wiring according to a heat generation level of the element.

In this manner, in the second embodiment of the present technology, the exposed portions 110 in which the metal wiring is exposed are provided on the substrate 100 in the positions directly below the heat generation portions 261 and 262 of the element having the stacked structure, and both of them are adhered to each other via the adhesive portion 190. Therefore, the heat generated in the element having the stacked structure may be radiated from the metal wiring 150 in the substrate 100.

3. Modified Example

In the above-described embodiment, the solder resist of the substrate 100 is opened in the circular shape or dot shape to expose the metal wiring 150 in the exposed portion 110. Then, by providing a large number of openings directly below a high heat generation portion and providing a small number of openings in a low heat generation portion, heat radiation from the high heat generation portion is promoted and temperature distribution in an element surface is uniformized. In contrast, various modified examples of opening shapes and arrangement of the exposed portions 110 are assumed as follows.

[Opening Shape]

Figure 9:
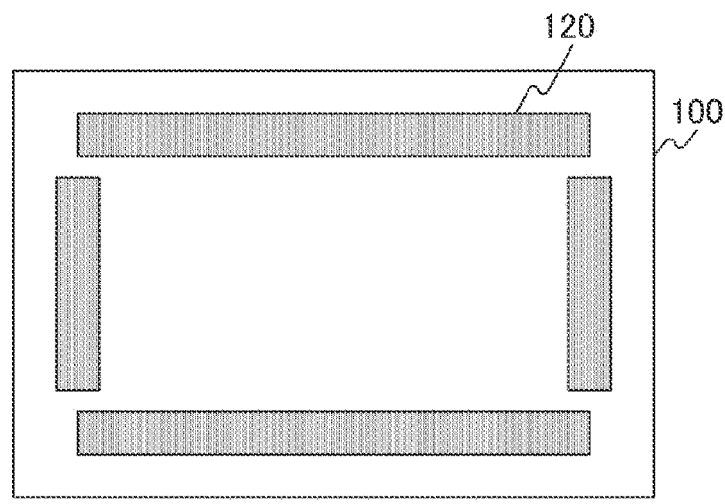
FIG. 9 is a view illustrating a first modified example of an exposed portion 110 in the embodiment of the present technology.

FIG. 9 is a view illustrating a first modified example of an exposed portion 110 in the embodiment of the present technology.

In this example, in a case where a heat generation portion is assumed around an element to be mounted as in the first embodiment described above, a large area of a solder resist of a substrate 100 in a position directly below the same is opened to expose an exposed portion 120. That is, an opening shape of the exposed portion 120 is rectangular. In this case, it is possible to linearly apply much adhesive portion 190 to the exposed portion 120 to adhere the element.

Such arrangement of the exposed portion 120 is applicable in a case where restriction in wiring on the substrate 100 is small.

Figure 10:
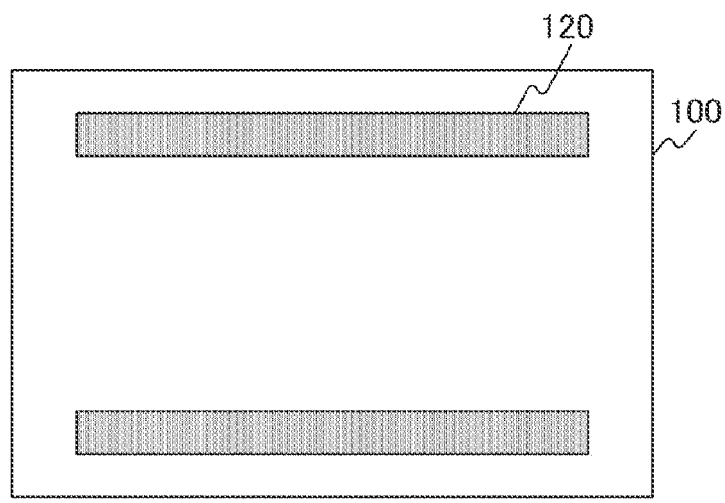
FIG. 10 is a view illustrating a second modified example of an exposed portion 110 in the embodiment of the present technology.

FIG. 10 is a view illustrating a second modified example of an exposed portion 110 in the embodiment of the present technology.

In this example, on the assumption that a heat generation amount on both sides of an element is small, exposed portions 120 are not provided on both sides of a substrate 100. However, it is also possible to apply an adhesive portion 190 thereon to adhere the element. Therefore, a heat radiation property may be adjusted.

[Opening Density]

Figure 11A:
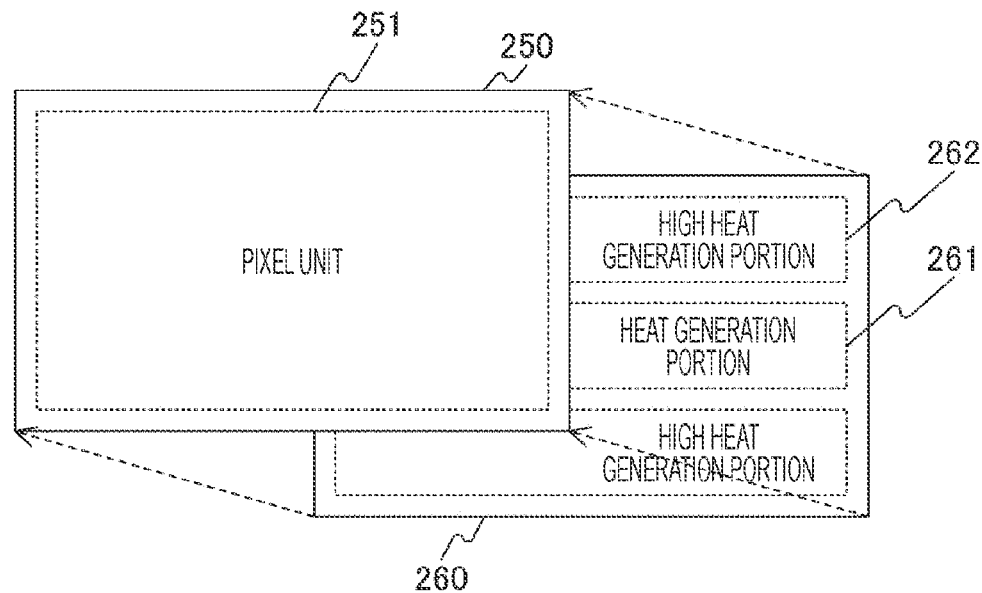
FIGS. 11A and 11B are views illustrating a third modified example of an exposed portion 110 in the embodiment of the present technology.
Figure 11B:
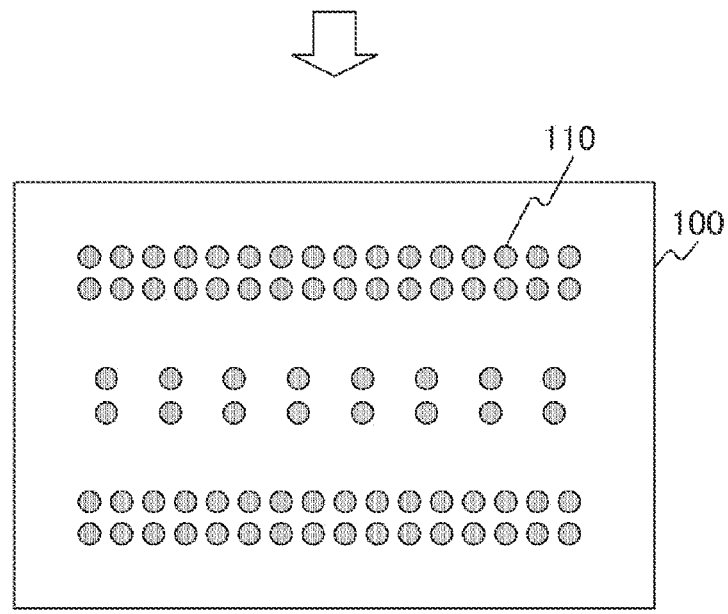

FIGS. 11A and 11B are views illustrating a third modified example of an exposed portion 110 in the embodiment of the present technology.

As illustrated in FIG. 11A of the drawing, in a case where there are heat generation portions 261 and 262 having different assumed heat generation amounts, density of the exposed portions 110 directly below them may be changed according to temperature distribution.

That is, as illustrated in FIG. 11B of the drawing, it is desirable that the exposed portions 110 directly below the high heat generation portion 262 of higher heat than that of the heat generation portion 261 are arranged at higher density. In this manner, it is possible to adjust heat radiation by changing the density of the exposed portions 110 and uniformize temperature distribution in an element surface.

[Opening Arrangement]

Figure 12A:
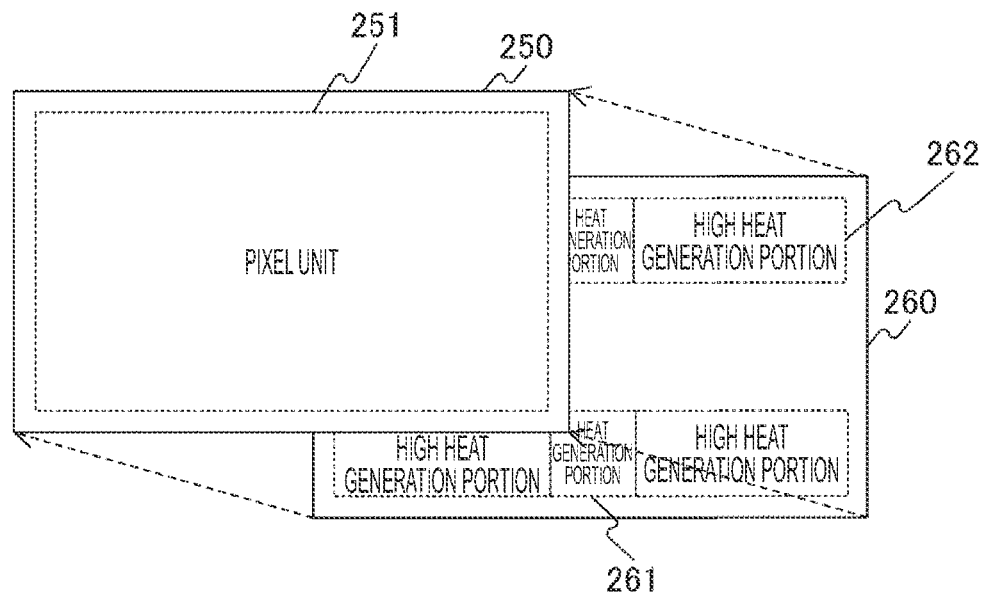
FIGS. 12A and 12B are views illustrating a fourth modified example of an exposed portion 110 in the embodiment of the present technology.
Figure 12B:
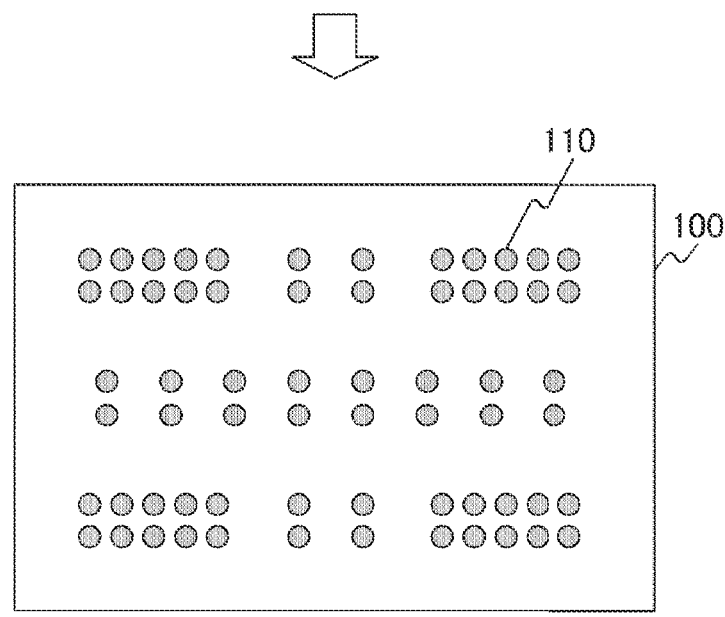

FIGS. 12A and 12B are views illustrating a fourth modified example of an exposed portion 110 in the embodiment of the present technology.

As illustrated in FIG. 12A of the drawing, in a case where a position of a heat generation portion in an element changes due to design restrictions of a solid-state imaging element and the like, exposed portions 110 may be arranged accordingly.

That is, as illustrated in FIG. 12B of the drawing, it is desirable to arrange the exposed portions 110 according to positions of heat generation portions 261 and 262. Moreover, by changing an application layout of an adhesive portion 190, a degree of freedom in adjusting a heat radiation property may be improved.

[Presence of Opening]

Figure 13A:
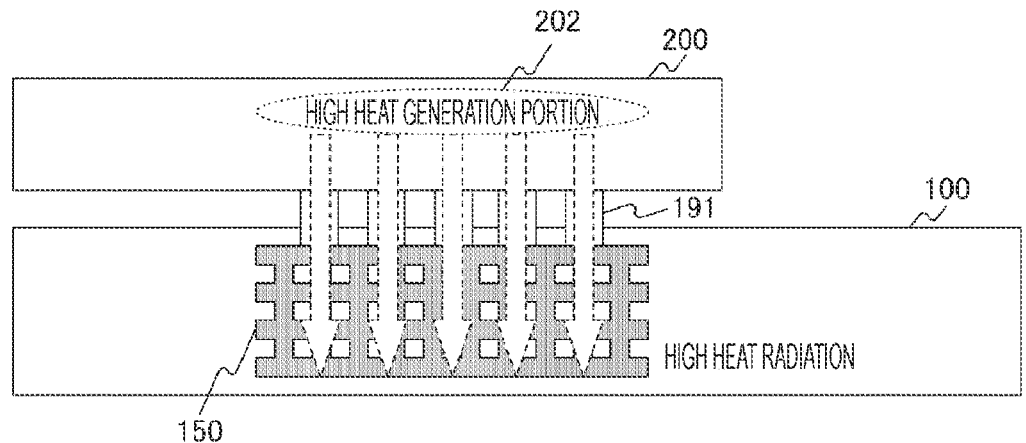
FIGS. 13A, 13B, and 13C are views illustrating a fifth modified example of an exposed portion 110 in the embodiment of the present technology.
Figure 13B:
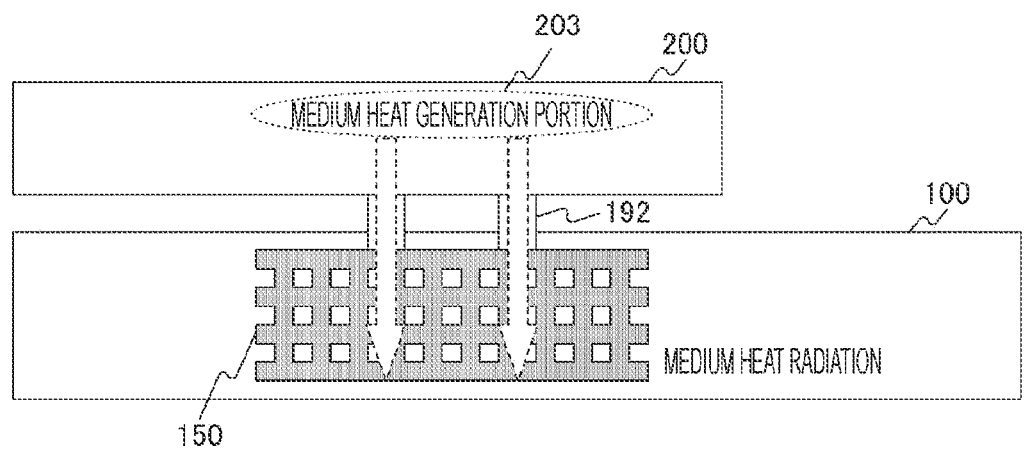
Figure 13C:
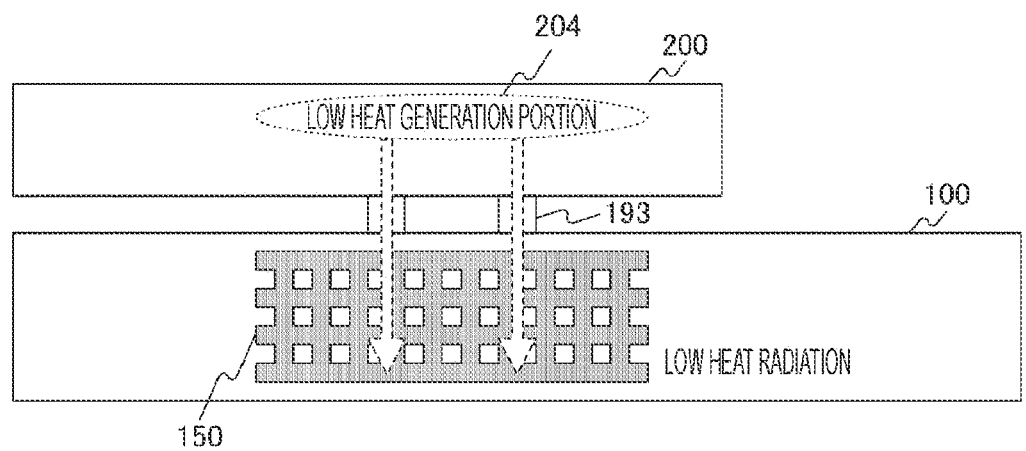

FIGS. 13A, 13B, and 13C are views illustrating a fifth modified example of an exposed portion 110 in the embodiment of the present technology.

As for a high heat generation portion 202 assumed to have a high heat generation amount, as illustrated in FIG. 13A of the drawing, it is desirable to provide many exposed portions 110 obtained by opening a solder resist of a substrate 100 and directly adhere a rear surface of a solid-state imaging element to metal wiring 150 with an adhesive portion 191, thereby further improving a heat radiation property.

In contrast, as for a medium heat generation portion 203 assumed to have a medium heat generation amount, as illustrated in FIG. 13B of the drawing, it is possible to provide a reduced number of exposed portions 110 and connect with an adhesive portion 192, thereby suppressing a heat radiation property. Therefore, it is possible to adjust the heat radiation property and uniformize temperature distribution in an element surface.

Furthermore, a low heat generation portion 204 assumed to have a low heat generation amount is adhered with an adhesive portion 193 without opening the solder resist of the substrate 100 and without exposing the metal wiring 150 of the substrate 100 as illustrated in FIG. 13C of the drawing. Therefore, it is possible to further suppress the heat radiation property and further uniformize the temperature distribution in the element surface.

Figure 14:
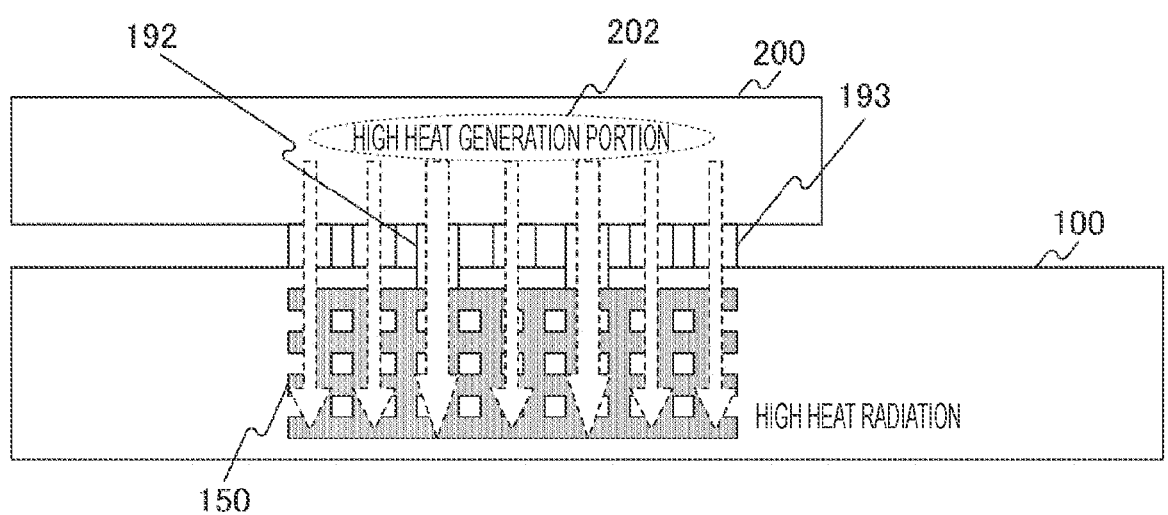
FIG. 14 is a view illustrating a sixth modified example of an exposed portion 110 in the embodiment of the present technology.

FIG. 14 is a view illustrating a sixth modified example of an exposed portion 110 in the embodiment of the present technology.

In this example, an example is illustrated in which an adhesive portion 192 of a portion in which metal wiring 150 is exposed and an adhesive portion 193 of a portion in which the metal wiring 150 is not exposed are mixed. For example, depending on a design of the metal wiring 150 of the substrate 100, a case is assumed where sufficient exposed portions 110 cannot be provided directly below a high heat generation portion 202 of a solid-state imaging element. In such a case, the adhesive portions 192 and 193 may be provided in combination as illustrated in the drawing. Therefore, a heat radiation property may be adjusted.

Furthermore, it is possible to more finely adjust the heat radiation property according to temperature distribution of an element by preparing a plurality of adhesives having different thermal conductivities as adhesive portions and combining them with arrangement of the exposed portions and an application layout of the adhesive portions as described above.

Note that the above-described embodiment describes an example of embodying the present technology, and there is a correspondence relationship between items in the embodiment and the matters specifying the invention in claims. Similarly, there is a correspondence relationship between the matters specifying the invention in claims and the matters in the embodiment of the present technology having the same names. However, the present technology is not limited to the embodiment and may be embodied by variously modifying the embodiment without departing from the gist thereof.

Note that the effect described in this specification is illustrative only and is not limitative; there may also be another effect.

Note that the present technology may also have a following configuration.

(1) A semiconductor device provided with:
a substrate provided with metal wiring;
a solid-state imaging element mounted on a surface of the substrate; and
an adhesive portion having predetermined thermal conductivity, the adhesive portion that adheres a predetermined region on one surface of the solid-state imaging element to the substrate.

(2) The semiconductor device according to (1) described above, in which
the adhesive portion has a larger area in a high temperature portion than in a low temperature portion according to temperature distribution of the solid-state imaging element.

(3) The semiconductor device according to (1) or (2) described above, in which
the substrate is provided with an insulating film on the surface,
the insulating film on the substrate is provided with an exposed portion that opens in the predetermined region to expose the metal wiring, and
the adhesive portion adheres the predetermined region of the solid-state imaging element to the metal wiring of the substrate.

(4) The semiconductor device according to (3) described above, in which
more exposed portions are arranged in a high temperature portion than in a low temperature portion according to temperature distribution of the solid-state imaging element.

(5) The semiconductor device according to (3) described above, in which
exposed portions are arranged in a high temperature portion at higher density than in a low temperature portion according to temperature distribution of the solid-state imaging element.

(6) The semiconductor device according to (3) described above, in which
exposed portions have a plurality of circular shapes.

(7) The semiconductor device according to any one of (1) to (6) described above, in which
the predetermined region is a region in which temperature reaches maximum temperature when the solid-state imaging element operates.

(8) The semiconductor device according to any one of (1) to (7) described above, in which
the predetermined region is a region occupied by a predetermined circuit in the solid-state imaging element.

(9) The semiconductor device according to (8) described above, in which
the predetermined circuit is an analog-to-digital conversion circuit.

(10) The semiconductor device according to any one of (1) to (9) described above, in which
the adhesive portion is provided with a plurality of types of adhesives having different thermal conductivities according to temperature distribution of the solid-state imaging element.

REFERENCE SIGNS LIST

100 Substrate
110, 120 Exposed portion
150 Metal wiring
190 to 193 Adhesive portion
200 Element
201 to 204, 221, 222, 261, 262 Heat generation portion
210, 251 Pixel unit
220 Circuit unit
250, 260 Layer
300 Wire
400 Frame body
500 Translucent material

The invention claimed is:

1. A semiconductor device, comprising:
a substrate that comprises metal wiring;
a solid-state imaging element mounted on a surface of the substrate; and
an adhesive portion having a specific thermal conductivity, wherein the adhesive portion adheres a specific region on one surface of the solid-state imaging element to the substrate, wherein
the substrate comprises an insulating film on the surface,
the insulating film comprises an exposed portion that opens in the specific region to expose the metal wiring, and
the adhesive portion adheres the specific region of the solid-state imaging element to the metal wiring of the substrate.

2. The semiconductor device according to claim 1, wherein
the adhesive portion has a larger area in a high temperature portion than in a low temperature portion, based on a temperature distribution of the solid-state imaging element.

3. The semiconductor device according to claim 1, wherein
the insulating film comprises exposed portions in a high temperature portion than in a low temperature portion, based on a temperature distribution of the solid-state imaging element.

4. The semiconductor device according to claim 1, wherein
the insulating film comprises exposed portions, and
a density of the exposed portions in a high temperature portion is higher than a density in a low temperature portion based on a temperature distribution of the solid-state imaging element.

5. The semiconductor device according to claim 1, wherein
the insulating film comprises exposed portions having a plurality of circular shapes.

6. The semiconductor device according to claim 1, wherein
the specific region is a region in which temperature reaches a maximum temperature when the solid-state imaging element operates.

7. The semiconductor device according to claim 1, wherein
the specific region is a region occupied by a specific circuit in the solid-state imaging element.

8. The semiconductor device according to claim 7, wherein
the specific circuit is an analog-to-digital conversion circuit.

9. The semiconductor device according to claim 1, wherein
the adhesive portion comprises a plurality of types of adhesives having different thermal conductivities based on a temperature distribution of the solid-state imaging element.

10. A semiconductor device, comprising:
a substrate that comprises metal wiring;
a solid-state imaging element mounted on a surface of the substrate; and
an adhesive portion having a specific thermal conductivity, wherein the adhesive portion adheres a specific region on one surface of the solid-state imaging element to the substrate, wherein
the adhesive portion comprises a plurality of types of adhesives having different thermal conductivities based on a temperature distribution of the solid-state imaging element.

* * * * *